(12) United States Patent
Cheng (10) Patent No.: US 9,989,791 B2
(45) Date of Patent: Jun. 5, 2018

(54) DISPLAY DEVICE

(71) Applicant: Japan Display Inc., Tokyo (JP)

(72) Inventor: Hsiang Yuan Cheng, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days. days.

(21) Appl. No.: 15/296,111

(22) Filed: Oct. 18, 2016

(65) Prior Publication Data

US 2017/0250237 A1 Aug. 31, 2017

(30) Foreign Application Priority Data

Feb. 25, 2016 (JP) .................................. 2016-034269

(51) Int. Cl.
*H01L 27/32* (2006.01)
*G02F 1/1333* (2006.01)
*H01L 51/00* (2006.01)
*G02F 1/1362* (2006.01)
*H01L 51/52* (2006.01)

(52) U.S. Cl.
CPC .. *G02F 1/133305* (2013.01); *G02F 1/136286* (2013.01); *H01L 51/0097* (2013.01); *H01L 51/5253* (2013.01); *Y02E 10/549* (2013.01)

(58) Field of Classification Search
CPC . H01L 27/32; H01L 27/3246; H01L 51/0097; H01L 51/5012
See application file for complete search history.

(56) References Cited

U.S. PATENT DOCUMENTS

| | | | | |
|---|---|---|---|---|
| 6,660,409 | B1* | 12/2003 | Komatsu | H01L 51/5256 257/100 |
| 2008/0128683 | A1* | 6/2008 | Kim | H01L 51/5246 257/40 |
| 2010/0277443 | A1* | 11/2010 | Yamazaki | G06F 1/1616 345/204 |
| 2015/0255522 | A1 | 9/2015 | Sato et al. | |
| 2016/0204366 | A1* | 7/2016 | Zhang | H01L 23/4985 257/40 |
| 2016/0218305 | A1* | 7/2016 | Kim | G02F 1/133305 |
| 2017/0047547 | A1* | 2/2017 | Son | H01L 51/5253 |

FOREIGN PATENT DOCUMENTS

| | | |
|---|---|---|
| JP | H5-333353 A | 12/1993 |
| JP | 2006-185679 A | 7/2006 |
| JP | 2015-169711 A | 9/2015 |

\* cited by examiner

*Primary Examiner* — Phuc Dang
(74) *Attorney, Agent, or Firm* — Typha IP LLC (57) ABSTRACT

In a display device using a substrate having flexibility, a drop in reliability due to defects such as cracks in the case where a substrate is made to curve is controlled. A display device is provided including a first substrate having flexibility, the first substrate including a curved part, an organic film covering a first surface of the first substrate and a second surface opposing the first surface in the curved part; and a pixel part and a drive circuit part arranged on the first surface.

13 Claims, 6 Drawing Sheets

DISPLAY DEVICE

CROSS-REFERENCE TO RELATED APPLICATIONS

This application is based upon and claims the benefit of priority from the prior Japanese Patent Application No. 2016-034269, filed on Feb. 25, 2016, the entire contents of which are incorporated herein by reference.

FIELD

One embodiment of the present invention is related to a substrate structure of a display device having flexibility.

BACKGROUND

A display device is disclosed in which an electroluminescent element or liquid crystal element is used as a display element and a circuit for driving the display element is formed using a thin film transistor. One form of a display device is disclosed in which it is possible to bend and curve using a substrate having flexibility (for example, Japanese Laid Open Patent Publication No. 2015-169711).

A display device includes a circuit element such as a thin film transistor or capacitor element and the like above a substrate, and a wiring part connecting the circuit element. In addition, an organic insulation film and inorganic insulation film buried between these layers or an organic insulation film arranged above each electrode for example is arranged on roughly the entire surface of a substrate. Here, when a substrate having flexibility is curved, stress is applied to a thin film arranged above the substrate and defects such as cracks and the like are produced which is a problem. That is, even if a substrate has flexibility, since a thin film such as an inorganic insulation film and the like arranged thereupon does not always include the same flexibility, defects such as cracks and the like are produced in the thin film when the flexible substrate is bent. For example, when defects such as cracks and the like are produced in an inorganic insulation film above a flexible substrate, water infiltrates from the defects and causes degradation of a display element in a pixel region.

SUMMARY

According to one embodiment of the present invention, a display device is provided including a first substrate having flexibility, the first substrate including a curved part, an organic film covering a first surface of the first substrate and a second surface opposing the first surface in the curved part; and a pixel part and a drive circuit part arranged on the first surface.

DESCRIPTION OF EMBODIMENTS

One aim of an embodiment of the present invention is to control a drop in reliability due to defects such as cracks and the like even in the case where a substrate is curved in a display device using a substrate having flexibility.

The embodiments of the present invention are explained below while referring to the diagrams. However, it is possible to perform the present invention using various different forms, and the present invention should not be limited to the content described in the embodiments exemplified herein. Although the width, thickness and shape of each component are shown schematically compared to their actual form in order to better clarify explanation, the drawings are merely an example and should not limit an interpretation of the present invention. In addition, in the specification and each drawing, the same reference symbols are attached to similar elements and elements that have been mentioned in previous drawings, and therefore a detailed explanation may be omitted where appropriate.

In the present specification, in the case where certain parts or regions are given as [above (or below)] other parts or regions, as long as there is no particular limitation, these include parts which are not only directly above (or directly below) other parts or regions but also in an upper direction (or lower direction). That is, in the case where certain parts or regions are given as [above (or below)] other parts or regions, other structural elements may be included between other parts or regions in an upper direction (or lower direction).

Figure 1:
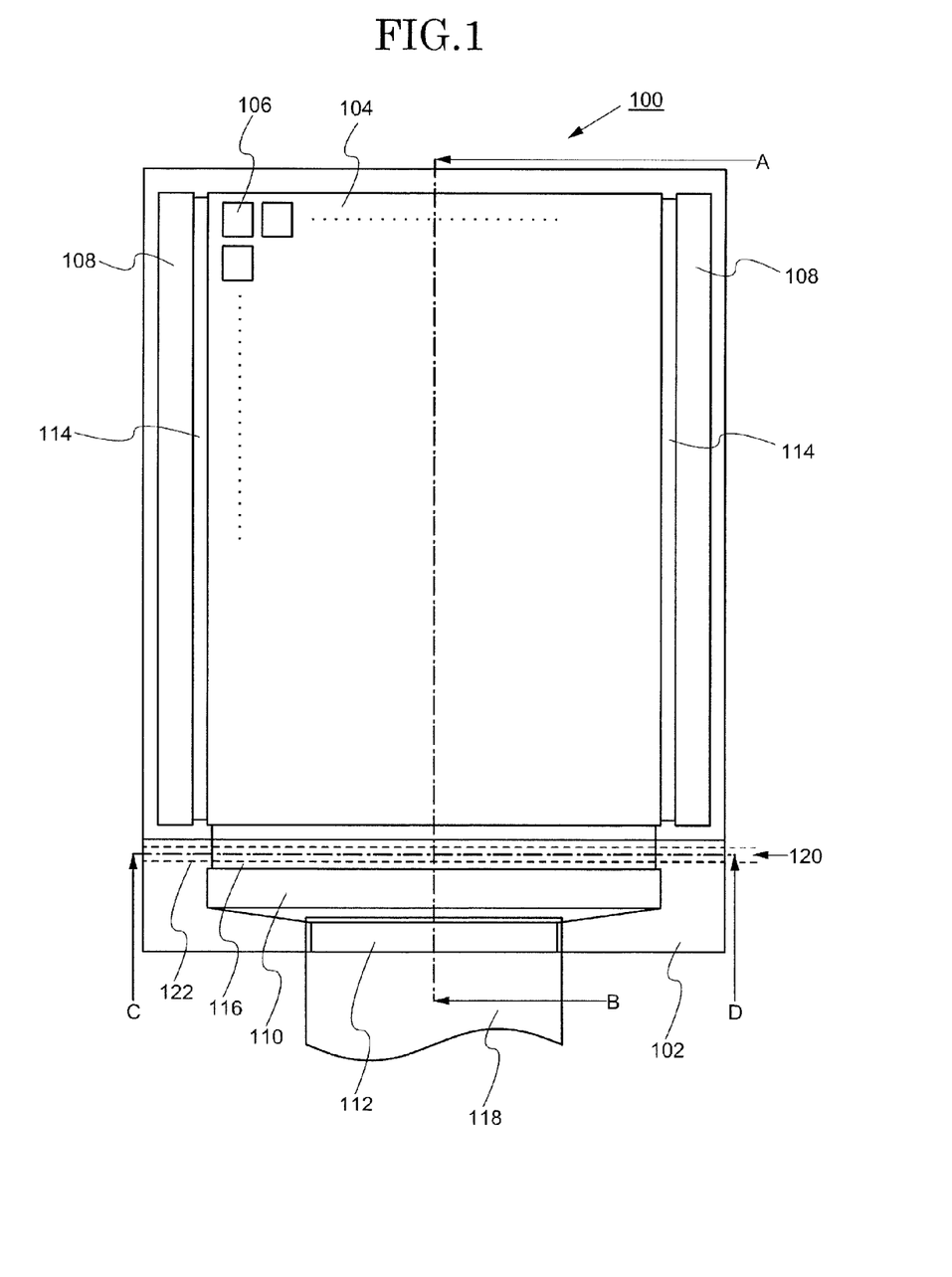
FIG. 1 is a planar view diagram showing a structure of a display device related to the present embodiment.
Figure 2:
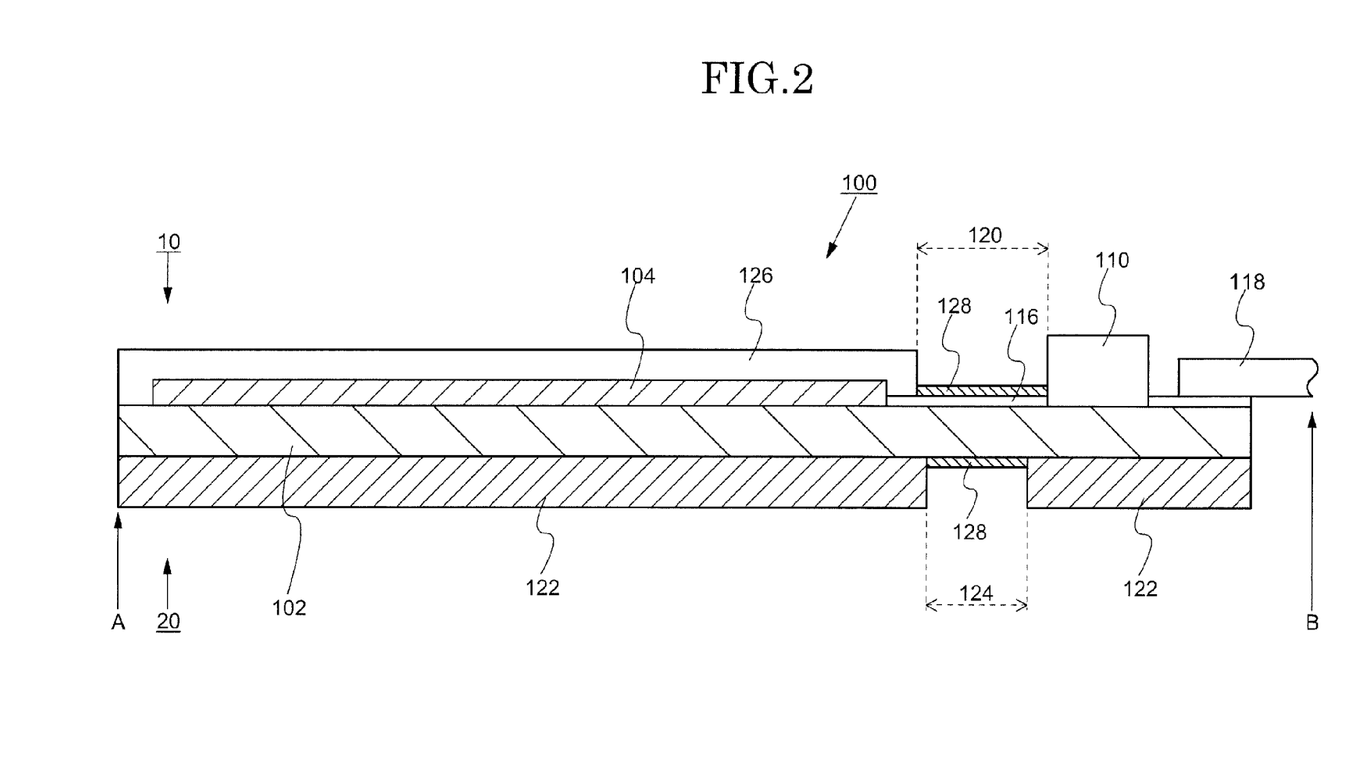
FIG. 2 is a cross-sectional diagram showing a structure of a display device related to the present embodiment and shows a structure along the line A-B shown in FIG. 1.
Figure 3:
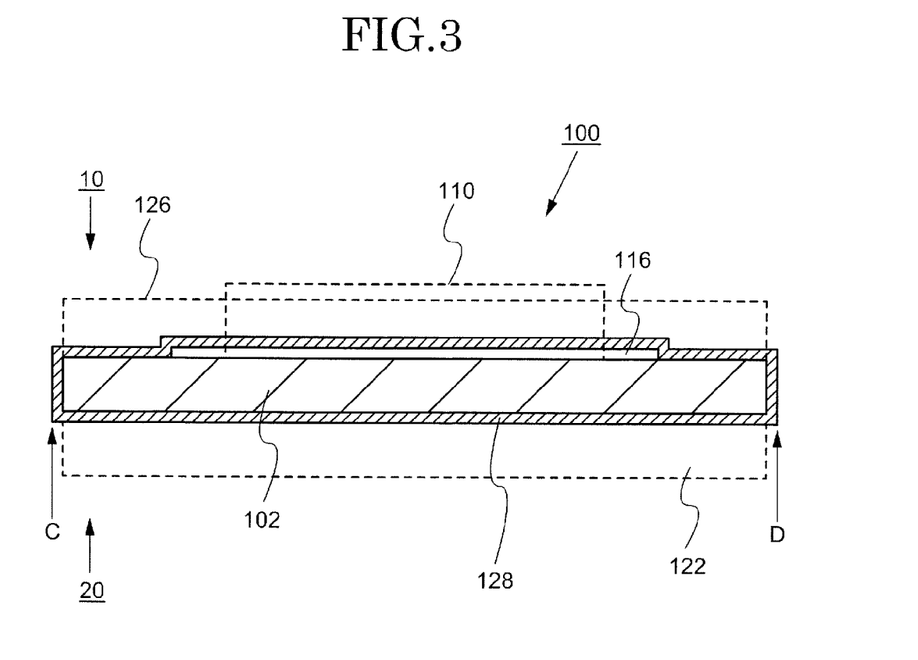
FIG. 3 is a cross-sectional diagram showing a structure of a display device related to the present embodiment and shows a structure along the line C-D shown in FIG. 1.

FIG. 1 shows a structure of a display device 100 related to one embodiment of the present invention. In addition, in the display device 100 shown in FIG. 1, a cross-sectional structure along the line A-B is shown in FIG. 2 and a cross-sectional structure along the line C-D is shown in FIG. 3. These diagrams are referred to in the explanation below.

The display device 100 includes a pixel part 104 arranged with a pixel 106 in a first surface 10 of a first substrate 102. The display device 100 includes a drive circuit part for driving the pixel 106 in a region (periphery region) on the exterior of the pixel 104 in the first substrate 102. The drive circuit includes a first drive circuit 108 which outputs a scanning signal and a second drive circuit 110 which outputs a video signal synchronized with the scanning signal. The second drive circuit 110 is a driver IC for example mounted above the first substrate 102. In addition, a terminal part 112 which is input with signals is arranged in a region on the exterior side of the first substrate 102. The terminal part 112 includes a terminal which is input with a video signal. The terminal part 112 is electrically connected to a wiring substrate 118. The driver IC described above, that is, the second driver circuit 110, may be mounted above the wiring substrate 118.

The first drive circuit 108, the second drive circuit 110 and the pixel part 104 are connected via wiring. This connection region includes wiring formed from a conductive film and an insulation layer buried with this wiring. In the present specification, this connection region in a region between a pixel part and a drive circuit part is referred to as a wiring part. The display device 100 includes a first wiring part 114 between the pixel part 104 and the first drive circuit 108, and a second wiring part 116 between the pixel part 104 and the second drive circuit 110.

In the present embodiment, the first substrate 102 includes flexibility. A resin material is used for the first substrate 102 which includes flexibility. It is preferred that a high molecular material including recurring units of imide bonds is used as the resin material, polyimide for example. Specifically, a film substrate with polyimide molded into a sheet shape may be used as the first substrate 102. In addition, as another form of the first substrate 102, it is possible to use a thin metal substrate, a compound substrate in which a resin film is bonded to a thin metal substrate, or a compound substrate in which a resin film is bonded to a thin glass substrate.

The display device 100 is arranged with a sealing member 126 opposing the first substrate 102. The sealing member 126 is also referred to as a second substrate opposing the first substrate 102. The pixel part 104 is covered by the sealing member 126. The sealing member 126 is formed from a cover film using a resin material or a sheet shaped component.

At least one part of the display device 100 includes a curved part 120. That is, by providing the first substrate 102 with flexibility, it is possible to provide a bent state to at least a part of the display device 100. The curved part 120 is a region in which the first substrate 102 bends or curves. When the first substrate 102 curves, parts which overlap with at least the curved part 120 within the pixel part, the drive circuit part and wiring part also curve together with the first substrate 102.

The display device 100 is arranged with a support member 122 in a second surface 20 opposing the first surface 10 of the first substrate 102. Although the support member 122 is arranged so as to cover roughly the entire surface of the first substrate 102, a notch part 124 is also included in at least a part of the support member 122. The support member 122 which is arranged close to the first substrate 102 essentially operates in the same way as increasing the thickness of a substrate. That is, the support member 122 controls bending of the first substrate 102. On the other hand, since the thickness of the first substrate 102 is maintained by the notch part 124 of the support member 122, the first substrate 102 may easily bend compared to regions where the support member 122 is arranged. A region of the first substrate 102 corresponding to the notch part 124 of the support member 122 becomes the curved part 120.

The support member 122 is formed from the same resin material as the first substrate 102 or a component which is harder than the first substrate 102. A resin substrate formed from a silicon resin and the like or a substrate such as an acrylic plate may be used as the support member 122. Furthermore, in the present embodiment, the support member 122 is not an essential structural component but a structural component which can be used appropriately. However, as described above, by using the support member 122, bending of the first substrate 102 is controlled, and by arranging the notch part 124, it is possible to set the position of the curved part 120 of the display device 100.

The notch part 124 of the support member 122 can be arranged at an arbitrary position and an arbitrary width. FIG. 2 shows a form in which the notch part 124 of the display device 100 is arranged between the pixel part 104 and second drive circuit 110. In other words, a region which overlaps with the second wiring part 116 of the display device 100 shown in FIG. 2 becomes the curved part 120.

As is shown in FIG. 2 and FIG. 3, the display device 100 includes an organic film 128 in a region including the curved part 120. The organic film 128 is arranged so as to cover an upper surface of the second wiring part 116 in the first surface of the first substrate 102. In other words, the organic film 128 is arranged in a region between the pixel part 104 and the second drive circuit part 110. The second wiring part 116 is covered and protected by the organic film 128. The organic film 128 is also arranged on the side of the second surface 20 of the first substrate 102. In addition, the organic film 128 is arranged to cover a region between the first surface 10 and second surface 20 of the first substrate 102, that is, to cover a side surface part of the first substrate 102. By arranging the organic film 128 in the first substrate 102 in this way, it is possible to use the organic film 128 as a protection film of the curved part 120. For example, even in the case where stress is concentrated on one part of the curved part 120 and defects such as cracks occur in the second wiring part 116, by arranging the organic film 128 continuously in the first surface 10 and second surface 20 of the first substrate 102, it is possible to ensure that defects are not exposed to the air.

Figure 4:
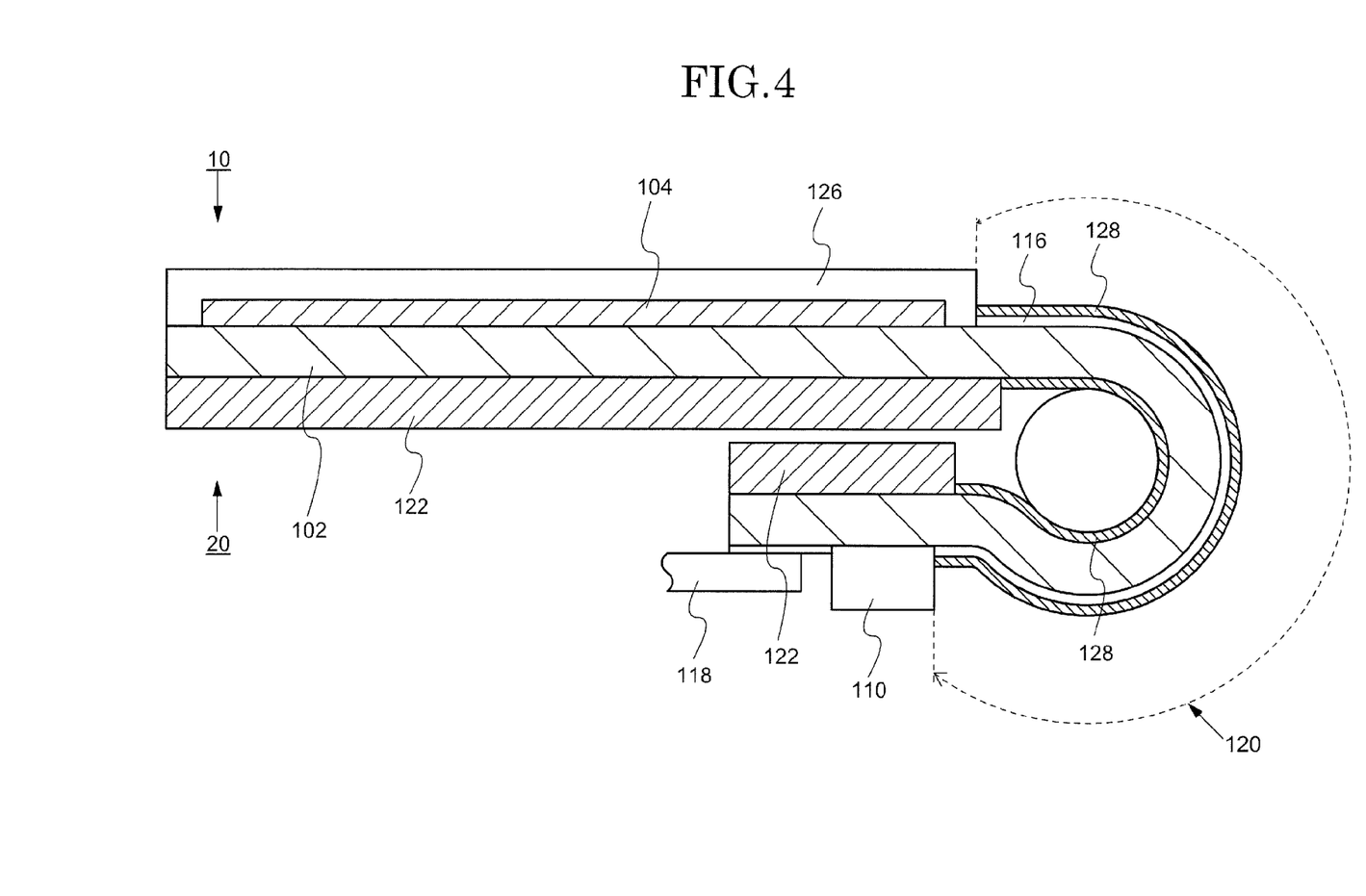
FIG. 4 is a cross-sectional diagram showing a structure of a display device related to the present embodiment and shows a state where a substrate is curved in the structure along the line A-B shown in FIG. 1.

FIG. 4 shows a state of the display device 100 when the first substrate 102 is made to curve in the curved part 120. The first substrate 102 curves so that the second drive circuit 110 is arranged on the rear surface side of the pixel part 104. Bending stress is applied to the curved part 120 of the first substrate 102. For example, bending stress is applied to the second wiring part 116 when the first substrate 102 is bent. That is, bending stress is applied to wiring included in the second wiring part 116 and an insulation layer buried with this wiring. In this case, although a metal film which forms the wiring is resistant to bending due to flexibility, defects such as cracks occur since at least an inorganic insulation layer among the insulation layers buried with the wiring is brittle. Defects such as cracks occurring in the second wiring part 116 proceed (grow) towards the pixel part 104. Supposing that defects such as cracks in the second wiring part 116 are exposed to the air, water and the like infiltrates to the pixel part 104 from the cracks which affects reliability of the display device 100.

The display device 100 related to the present embodiment is arranged with the organic film 128 covering the second wiring part 116. As is shown in FIG. 3 and FIG. 4, the organic film 128 is not arranged in the entire region of the display device 100 but in a part of the display device 100 which includes at least the curved part 120. In this part, the organic film 128 is arranged continuously in the first surface 10, second surface 20 and a side surface which intersects both the first surface 10 and second surface 20. In other words, the organic film 128 is arranged across the entire periphery of one part of the display device 100 including at least the curved part 120. Since the organic film 128 includes flexibility the same as the first substrate 102, the organic film 128 has a high resistance to bending and it is difficult for defects such as cracks to occur. The organic film 128 is also arranged along a curved surface of the first substrate 102 in the curved part 120. As a result, even if defects such as cracks occur in an insulation layer of the second wiring part 116, such defects are not exposed to the exterior. In addition, the display device 100 includes a part (non-curved part) which is different to the curved part 120 and the non-curved part includes a region in which the organic film 128 is not formed. That is, it is not the case that the organic film 128 is arranged continuously in the entire periphery (that is, all of the first surface 10, second surface 20 and side surface intersecting both the first surface 10 and second surface 20) of the display device 100.

Furthermore, by using a cover film with low moisture permeability (high resistance to gas or high moisture resistance) as the organic film 128, it is possible to maintain reliability of the display device 100 even if defects such as cracks occur in the second wiring part 116. It is desirable that a material which has excellent non-moisture permeability properties (gas barrier properties) and mechanical characteristics (resistance to bending) be used as the organic film 128.

It is preferred that polychloropyroxyline is used as the organic film 128 or the organic film 128 contains polychloropyroxyline. Various types of polychloropyroxyline are known that have different molecular structures such as parylene C, parylene N and parylene D. Although any one of parylene C, parylene N and parylene D may be used as the organic film 128, among these it is preferred that parylene C is used since it is has the highest resistance to moisture.

A polychloropyroxyline thin film as the organic film 128 can be manufactured using a vacuum deposition method. A polychloropyroxyline thin film manufactured using a vacuum deposition method grows at molecular units. As a result, regardless of the shape of a deposition surface, it is possible to uniformly form a polychloropyroxyline thin film even in fine gaps. A polychloropyroxyline thin film can be formed using a vacuum deposition method with a thickness from a few micrometers to a few tens of micrometers and it is possible to exhibit sealing capabilities even at this thickness. Furthermore, when arranging the organic film 128 in the curved part 12, a shadow mask including an aperture part corresponding to the curved part 120 of the first substrate 102 may be used when forming the polychloropyroxyline thin film. By using a shadow mask when forming a film, it is possible to selectively grow a polychloropyroxyline thin film in the curved part 120 without forming the organic film 128 in other regions such as the pixel part 104.

In this way, according to one embodiment of the present invention, it is possible to prevent a drop in reliability due to defects such as cracks even in the case where a substrate is curved in a display device using a substrate having flexibility.

Figure 5:
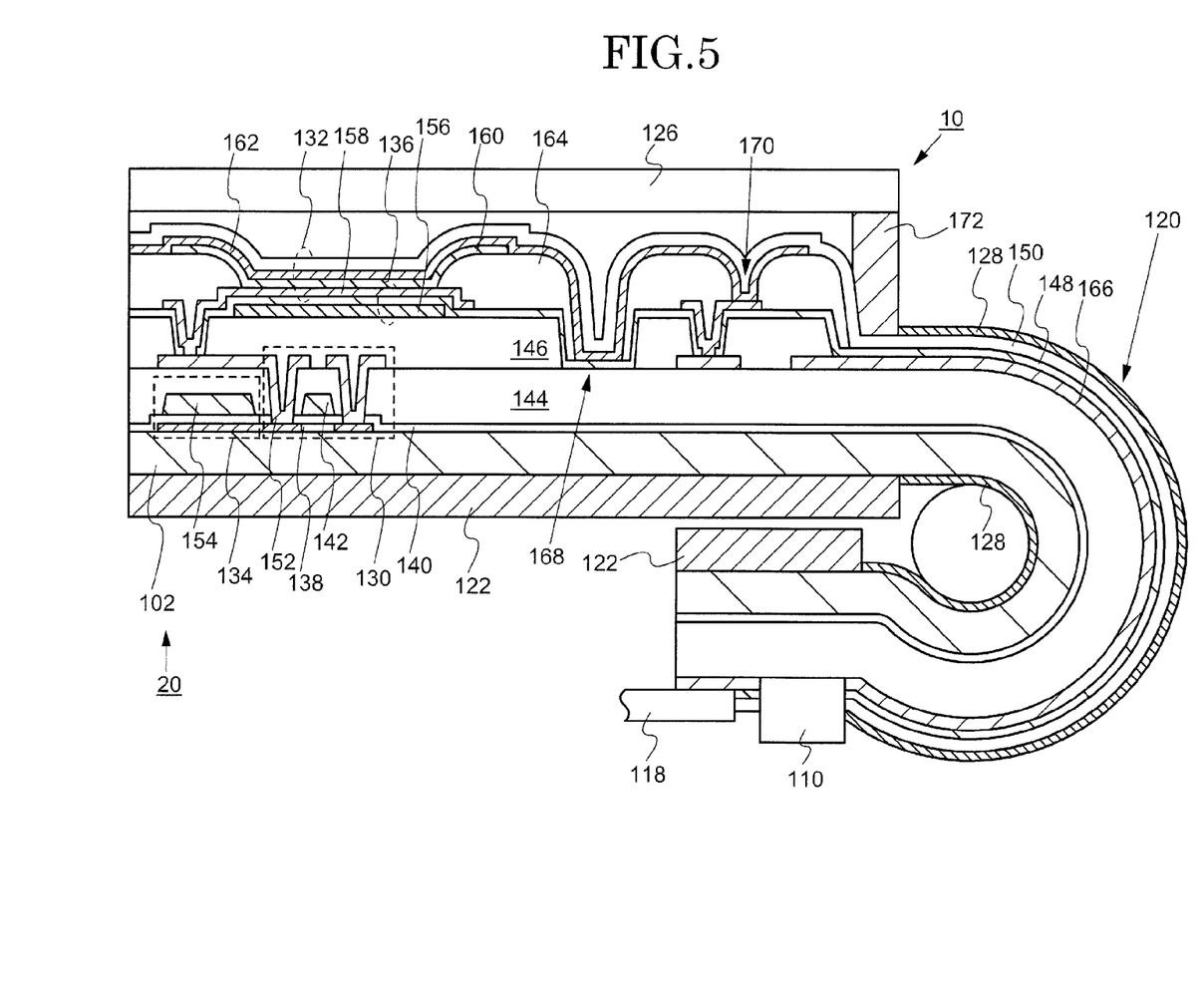
FIG. 5 is a cross-sectional diagram showing a structure of a display device related to the present embodiment and shows a state where a substrate is curved in the structure along the line A-B shown in FIG. 1.
Figure 6:
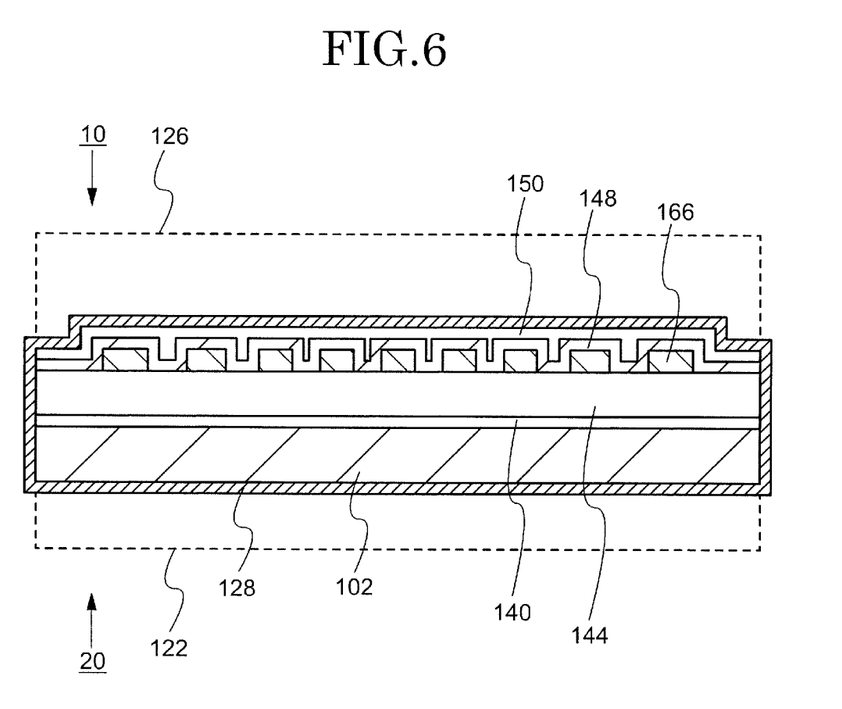
FIG. 6 is a cross-sectional diagram showing a structure of a display device related to the present embodiment and shows a structure along the line C-D shown in FIG. 1.

Next, details of the display device 100 related to the present embodiment are explained while referring to FIG. 5 and FIG. 6. A cross-sectional structure corresponding to the line A-B shown in FIG. 1 is shown in FIG. 5 and a cross-sectional structure corresponding to the line C-D is shown in FIG. 6. Furthermore, FIG. 5 shows a state in which the display device 100 is bent by the curved part 120 and FIG. 6 shows a cross-sectional view of the curved part 120.

In the display device 100, the first substrate 102 is curved by the curved part 120 and the second drive circuit 110 and terminal part 112 are arranged on the rear surface side (second surface 20 side) of the pixel part 104. The second wiring part 116 is arranged between the pixel part 104 and the second drive circuit 110. The second wiring part 116 is arranged along a curved surface of the curved part 120.

The pixel part 104 is arranged in the first surface 10 of the first substrate 102. The example shown in FIG. 5 shows a form in which a transistor 130, light emitting element 132, first capacitor element 134 and second capacitor element 136 are included in a pixel 106. The light emitting element 132 is electrically connected with the transistor 130. The first capacitor element 134 stores a gate voltage of the transistor 130 and the second capacitor element 136 is additionally arranged in order to adjust the amount of current flowing to the light emitting element 132. Furthermore, the pixel 106 shown in FIG. 5 is only an example and a pixel may be formed by a transistor and a light emitting element or by a transistor, light emitting element and a first capacitor element. Alternatively, elements other than a transistor, light emitting element and first capacitor element may also be added to form a pixel.

The transistor 130 includes a structure in which a semiconductor film 138, gate insulation film 140 and gate electrode 142 are stacked. A source/drain electrode 152 is arranged on an upper surface of the first insulation film 144. The source/drain electrode 152 contacts a source region of the semiconductor film 138 or a region corresponding to a drain region for achieving electrical conduction. A second insulation film 146 is arranged as a planarized layer above the source/drain electrode 152. In addition, the light emitting element 132 is arranged above the second insulation film 146. The first insulation film 144 is formed using an inorganic insulation material and the second insulation film 145 is formed using an organic insulation material as the structure of the pixel 104. The first capacitor element 134 is formed including a region in which the semiconductor film 138 and a first capacitor electrode 154 overlap using the gate insulation film 140 as a conductive film, and a region in which the source/drain electrode 152 and the first capacitor electrode 154 overlap using the gate insulation film 140 as a conductive film. The second capacitor element 136 is formed in a region in which the first electrode 158 and second capacitor electrode 156 overlap using a third insulation film 148 arranged above the second insulation film 146 as a conductive film. The third insulation film 148 is formed from an inorganic insulation material such as silicon oxide, silicon nitride or silicon oxynitride.

The light emitting element 132 includes a structure in which the first electrode 158 (pixel electrode) electrically connected with the transistor 140, light emitting layer 160, and second electrode 162 (common electrode) are stacked. The light emitting element 132 controls emitted light by controlling the potential between the first electrode 158 and second electrode 162. The pixel part 104 includes a bank layer 164 which covers a periphery edge of the first electrode 158 and exposes an interior region. The light emitting layer 160 is arranged across the bank layer 164 from an upper surface of the first electrode 158. The second electrode 162 covers an upper surface of the light emitting layer 160 and is arranged across roughly the entire surface of the pixel part 104.

The light emitting layer 160 is a layer including an organic electroluminescence material as a light emitting material. The light emitting layer 160 is formed using a low molecular or high molecular organic material. In the case where a low molecular material is used for the light emitting layer 160, in addition to the light emitting layer which includes an organic material with light emitting properties, one or a plurality of a hole injection layer, electron injection layer, hole transport layer and electron transport layer sandwiching the light emitting layer may also be included. Since the light emitting layer 160 degrades due to water, a fourth insulation film 150 is arranged above the second electrode 162. The fourth insulation film 150 is arranged on roughly the entire surface of the pixel part 104.

A single layer of or stacked layer body of an inorganic insulation film such as silicon nitride, silicon oxide or aluminum oxide is used as the fourth insulation film 150. Furthermore, an insulation film comprised from a stacked layer body of an organic insulation film and inorganic insulation film may be arranged above the fourth insulation film 150. A sealing member 126 is arranged on an upper surface side of the fourth insulation film 150. FIG. 5 shows the case where the sealing member 126 is a sheet shaped substrate. In this case, the sealing member 126 is fixed to the first substrate 102 by a sealing material 172 which encloses the outer periphery of the pixel part 104. Gaps are present between the fourth insulation film 150 and sealing member 126 and these gaps may be filled with a filler material. A resin material is used for the filler material.

An aperture part 168 which splits the second insulation film 146 and bank layer 164 is included between an end part (region contacting the sealing material 172) of the pixel part 104 and a pixel 106. The third insulation film 148 formed from an inorganic material and the second electrode 162 are arranged so as to cover a side surface and bottom surface of the aperture part 168. In other words, a region is included in which the third insulation film 148 and second electrode 162 contact in the aperture part 168. By adopting this type of structure, the light emitting layer 160 is essentially enclosed and sealed by the third insulation film 148 and second electrode 162. That is, by adopting this type of sealing structure, water and the like is prevented from passing through the second insulation film 146 which is formed from an organic resin material and the bank layer 164, and infiltrating the light emitting layer 160. In addition, the pixel part 104 is arranged with a connection part 170 in which the second electrode 162 is electrically connected with lower layer wiring.

The first substrate 102 is arranged with first wiring 166 from the pixel part 104 to the second drive circuit 110. A region in which the first wiring 166 is arranged is also a region corresponding to the curved part 120. For example, the first wiring 166 is formed in the same layer as the source/drain electrode 152. For example, the first wiring 166 includes a structure in which an aluminum film (Al) and a metal film with a high melting point such as titanium (Ti) or molybdenum (Mo) are stacked above and below the aluminum film. The third insulation film 148 and fourth insulation film 150 arranged extending from the pixel part 104 are stacked above the first wiring 166. Although the curved part 120 exists in a region on the outer side of the sealing member 126, by arranging the third insulation film 148 and fourth insulation film 150, the first wiring 166 is protected by these insulation films and is never exposed directly to the air.

The organic film 128 is arranged in the curved part 120. That is, the organic film 128 is arranged in a region on the outer side of the sealing member 126. The organic film 128 is preferred to be arranged as the outermost layer in the curved part 120. FIG. 5 includes a structure in which the gate insulation film 140, first insulation film 144, first wiring 166, third insulation film 148 and fourth insulation film 150 are stacked above the first substrate 102 in the curved part 120. Furthermore, the organic film 128 is arranged above the fourth insulation film 150.

When the first substrate 102 is curved, bending stress is applied to the second wiring part 116. At this time, since the first wiring 166 is a metal film, it is possible to be deform in response to bending of the substrate which is flexible. However, since the third insulation film 148 and fourth insulation film 150 are formed from an inorganic material, when the first substrate 102 is curved, defects such as cracks occur due to brittleness. When defects such as cracks which occur in these inorganic insulation films spread towards the pixel part 104, water and the like in the air infiltrates the pixel part 104 from these defects. For example, when the first substrate 102 is repeatedly bent by the curved part 120, stress is repeatedly applied to the second wiring part 116 and thereby defects such as cracks occurring in an inorganic insulation film grow.

As described previously, a water blocking structure is adopted for the display device 100 in which the third insulation film 148 and second electrode 162 are in close contact in the aperture part 168. As a result, the display device 100 can to a certain extent prevent water from infiltrating to the light emitting layer 160. However, a contact hole which electrically connects the first electrode 158 and the source/drain electrode 152, and a contact hole which electrically connects the source/drain electrode 152 and the semiconductor film 138 are arranged in a pixel 106. These contact holes are formed in the first insulation film 144 or second insulation film 146. Water and the like which infiltrates from the exterior to the pixel part 104 can form a path which infiltrates to a region in which the light emitting layer 160 is arranged via a contact hole which passes through the first insulation film 144 or second insulation film 146. Due to this, degradation of a light emitting element 132 in the pixel part 104 occurs after manufacture of the display device 100 which leads to a decrease in display quality.

However, in the present embodiment, the organic film 128 covers the top of the fourth insulation film 150 in the curved part 120. As a result, it is possible to prevent defective parts from being exposed to the air even when these defects such as cracks occur in either the gate insulation film 140, first insulation film 144, third insulation film 148 and fourth insulation film 150 which are inorganic insulation films.

Defects such as cracks which occur in the second wiring part 116 also easily occur in an end part of the first substrate 102 where stress is easily concentrated. However, as is shown in FIG. 6, by arranging the organic film 128 to cover the entire periphery of the first substrate 102, it is possible to ensure that defects are not exposed to the air even when defects such as cracks occur in an end part of the first substrate 102.

In addition, as is shown in FIG. 6, the second wiring 116 is mixed with a region in which the gate insulation film 140, first insulation film 144, first wiring 166, third insulation film 148 and fourth insulation film 150 are stacked above the first substrate 102 from the first substrate 102 side, and a region in which the gate insulation film 140, first insulation film 144, third insulation film 148 and fourth insulation film 150 are stacked. Stress is concentrated in a boundary between these two regions when the first substrate 102 bends due to a difference in their stacked structures. For example, it is possible that stress is concentrated in the third insulation film 148 which covers the first wiring 166. Even in this case, by arranging the organic film 128 in an outermost layer, it is possible to prevent defective parts from being exposed to the air even when defects occur in the third insulation film 148.

Although a form is shown in the present embodiment in which the curved part 120 of the display device 100 is arranged in a region overlapping the second wiring part 116, the present invention is not limited to this structure. For example, the curved part 120 may also be arranged to overlap the first wiring substrate 114. In addition, the curved part 120 may also be arranged to intersect the pixel part 104. In either case, by arranging the organic film 128 as an outermost layer in the curved part 120 where the first substrate 102 bends, it is possible to increase resistance to problems that can occur due to bending of the first substrate 102.

Although a form is shown in the present embodiment in which the light emitting element 132 is arranged in the pixel part 104 as a display element, the light emitting element can also be applied to display devices formed with a pixel using other display elements. For example, the structure shown in the present embodiment can also be applied to a liquid crystal display device using liquid crystal elements as a display element.

Based on the display device described in the embodiments of the present invention, a person ordinarily skilled in the art could appropriately perform an addition or removal of structural components or design modification or an addition of processes or an omission or change in conditions which are included in the scope of the present invention as long as they do not depart from the subject matter of the present invention.

In addition, other effects that are different from those provided by the embodiments described above are obvious from the description in the specification, and effects that could be easily conceived of by a person ordinarily skilled in the art should be interpreted as also being provided by the present invention.

What is claimed is:

1. A display device comprising:
    a first substrate having flexibility, the first substrate including a curved part;
    an organic film covering a first surface of the first substrate, a second surface opposing the first surface, and a side surface intersecting the first and second surfaces in the curved part; and
    a pixel part and a drive circuit part arranged on the first surface.

2. The display device according to claim 1, wherein the first substrate has an area which is different from the curved part, and
    the organic film is not arranged on at least a part of the area.

3. The display device according to claim 1, wherein the organic film is arranged in a region between the pixel part and the drive circuit part.

4. The display device according to claim 1, wherein a wiring part is located between the pixel part and the drive circuit part and the organic film covers the wiring part.

5. The display device according to claim 1, further comprising a sealing material sealing the pixel part,
    wherein the sealing material faces the first substrate and does not overlap the curved part.

6. The display device according to claim 1, wherein the organic film is formed from polychloroparaxylene.

7. The display device according to claim 1, wherein the pixel part includes a plurality of pixels and each of the plurality of pixels has a light emitting element including an organic electroluminescence material.

8. The display device according to claim 1, wherein the pixel part includes a plurality of pixels and each of the plurality of pixels includes a liquid crystal element.

9. A display device comprising:
    a curved part;
    a non-curved part;
    a first region including the curved part;
    a second region different from the first region and located in the non-curved part,
    an organic film covering a first entire periphery of the first region, and having a portion which does not cover a second entire periphery of the second region, the first entire periphery including a pair of main surfaces and a side surface intersecting the main surfaces.

10. The display device according to claim 9, wherein the organic film is formed from polychloroparaxylene.

11. The display device according to claim 9, wherein a pixel part includes a plurality of pixels,
    a peripheral region is adjacent to the pixel part and includes a plurality of terminals, and
    the curved part is located in the peripheral region.

12. The display device according to claim 9, wherein the entire periphery of the first region includes a top surface, a bottom surface opposite to the top surface, and a side surface intersecting the top surface and the bottom surface.

13. The display device according to claim 12, wherein the organic film covers the top surface, the bottom surface, and the side surface continuously.

* * * * *